US006635511B2

(12) United States Patent
Holcombe

(10) Patent No.: US 6,635,511 B2
(45) Date of Patent: Oct. 21, 2003

(54) INTEGRATED BALL GRID ARRAY-PIN GRID ARRAY-FLEX CIRCUIT INTERPOSING PROBE ASSEMBLY

(75) Inventor: Brent A. Holcombe, Bellingham, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 178 days.

(21) Appl. No.: 09/765,173

(22) Filed: Jan. 18, 2001

(65) Prior Publication Data

US 2002/0094672 A1 Jul. 18, 2002

(51) Int. Cl.⁷ .......................... H01L 21/44; H01L 21/48
(52) U.S. Cl. ...................... 438/108; 438/109; 438/613; 438/617
(58) Field of Search ................................. 438/128, 106, 438/108, 109, 611–3, 455, 613, 617; 439/83, 70, 342, 912

(56) References Cited

U.S. PATENT DOCUMENTS 6,213,787 B1 * 4/2001 Murphy ........................ 439/71
6,325,280 B1 * 12/2001 Murphy ....................... 228/246

* cited by examiner

Primary Examiner—Caridad Everhart
(74) Attorney, Agent, or Firm—Regan L. Trumper

(57) ABSTRACT

The method of the invention comprises the steps of soldering a BGA socket onto a PGA header, inserting a flex assembly onto the BGA-PGA assembly, placing solder preforms over the PGA pins and then reflowing the flex assembly to the BGA-PGA assembly.

12 Claims, 3 Drawing Sheets

INTEGRATED BALL GRID ARRAY-PIN GRID ARRAY-FLEX CIRCUIT INTERPOSING PROBE ASSEMBLY

BACKGROUND

The present invention relates generally to electronic test instruments and more particularly to a test probe assembly for electrically connecting a ball grid array surface mount package to an electronic measurement device.

Ball grid array (BGA) has become the package of choice in the surface mount technology arena. BGA's offer many advantages over standard fine-pitch surface mount and pin grid array technologies. These advantages include reduced placement problems since BGAs are self-centering, reduced handling issues because there are no leads to damage, lower profile and higher interconnect density. There is, however, a significant drawback with BGA technology: the lack of established BGA test accessories and procedures.

Electronic test instruments (e.g., oscilloscope, logic analyzer, emulator, etc.) are used to analyze various electrical aspects of the IC including voltage and current waveforms. Typically, a loaded printed circuit board is crowded with various electrical components, including multiple IC packages. Due to the close spacing of components on the board (i.e., high "board density") it is often difficult to electrically connect the ICs to the test instrument. BGAs tend to exacerbate this problem since there are no "leads to access for testing purposes.

As processor packages become more dense due to electrical requirements, it has become increasingly difficult to probe these packages. With pin counts in the 600–700 range, and pin to pin spacing now at 0.050 inches or less, it has become necessary for motherboard sockets to go to BGA style packages vs. the former pin grid array ("PGA") packages. This trend has increased the difficulty in reliably dividing and attenuating signals within the interstitial array of pins.

Also, increasing pin counts and pin densities increases the insertion force required to insert the processor into a conventional low insertion force socket. Typically, the collective insertion force required to insert a 603 pin processor is approximately 55–60 lbs. of force.

Construction of probes using BGA-PGA-Flex is exceedingly difficult due to the extremely small size of the architecture involved and the corresponding density of components. Such construction involves soldering a BGA socket to a PGA header, soldering passive components to a flexible circuit and then attaching the flexible circuit to the PGA header. One concern encountered in this process is inhibiting solder migration up the BGA socket clips during soldering of the BGA. Such migration substantially increases potential contamination of the BGA socket. Another concern is soldering the BGA without allowing the 0201 resistors to separate from the flex.

SUMMARY

The present invention creates an ordered series of soldering steps and continuity tests designed to build a BGA-PGA-Flex probe while inhibiting migration of solder during the soldering steps. The process of the invention results in a tested probe with reliable solder joints all the way through.

The method of the invention comprises the steps of soldering a BGA socket onto a PGA header, inserting a flex assembly onto the BGA-PGA assembly, placing solder preforms over the PGA pins and then reflowing the flex assembly to the BGA-PGA assembly.

DETAILED DESCRIPTION OF THE INVENTION

Figure 1:
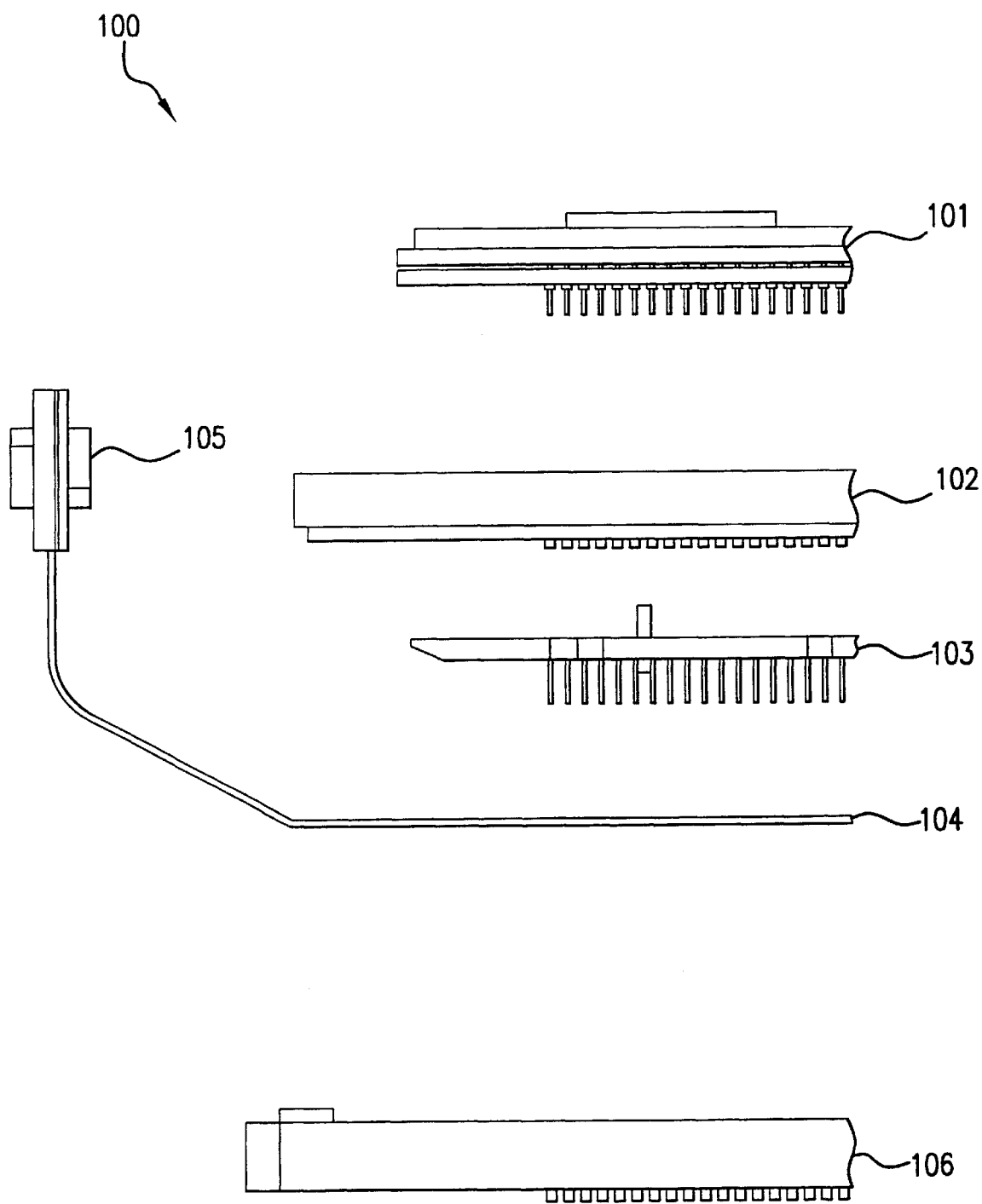
FIG. 1 is an exploded partial side view of the components used in a BGA-PGA-Flex probe.

FIG. 1 shows a side view of the components used in a BGA-PGA-Flex probe assembly utilized in accordance with the method of the invention. Generally, the probe assembly permits use of a user's BGA ZIF socket.

Referring to FIG. 1, the BGA-PGA-Flex probe assembly 100 comprises a microprocessor 101, a BGA socket 102, a PGA header 103, a flexible circuit 104, a matched impedance connector 105 and a probe assembly plug 106.

Figure 2:
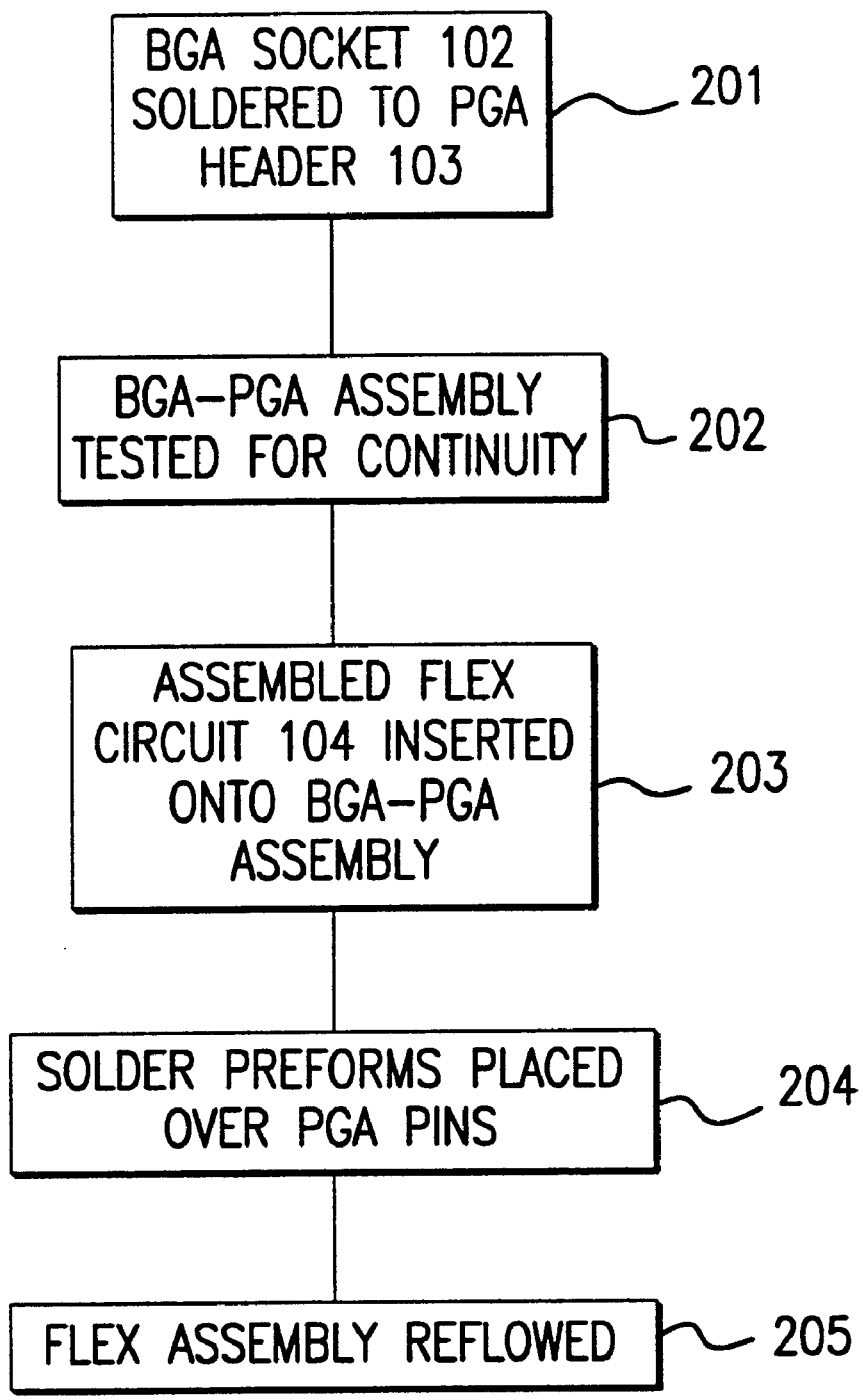
FIG. 2 is a flow diagram of a preferred embodiment of the method of the invention.

FIG. 2 shows a flow chart of an embodiment of a method of the invention. Referring also to the components identified in FIG. 1, at step 201 the BGA socket 102 is soldered onto the PGA header 103. Preferably, reflow is used to solder the BGA socket 102 to the PGA header 103. Those skilled in the art will recognize reflow as a common method of soldering a BGA. In a preferred embodiment, the BGA-PGA assembly is tested for continuity at step 202.

Step 203 shows that an assembled flexible circuit 104 is then inserted onto the BGA-PGA assembly. At step 204 solder preforms are placed over each PGA pin. The flex assembly is reflowed to form a solder connection by melting the preforms at step 205. Importantly, a reflow technique is used at this point that inhibits, or minimized, solder migration down the BGA socket clips. Preferably, a localized hot air source is used to effect reflow of the preforms with minimal migration. Typically, a 63-37 solder is used for the preforms. 63-37 solder is a tin-lead composite solder. Under normal conditions, 63-37 solder reflows at approximately 183° C. Preferably, a temperature ranging from 200° C. to 250° C. can be used to achieve adequate reflow of the preforms without causing migration of the solder. A period of 1–2 minutes for heat application is preferred.

Also preferably, an IR source is used to effect reflow of the preforms with minimal migration. Those skilled in the art will recognize that any reflow technique that localized heat to only one side of the assembly can be useful in minimizing reflow. Temperature ranges for use with an IR source will be substantially the same as that used with a localized hot air source.

In a preferred embodiment of the invention (not shown in FIG. 2), the method of the invention comprises assembling the assembled flexible circuit 104 prior to inserting the flex assembly onto the BGA-PGA assembly. Assembling the flex assembly 104 can be done at anytime prior to placing the flex assembly on the BGA-PGA assembly and need not occur after the BGA-PGA assembly has been soldered together. This step in the method comprises placing Surface Mount Technology ("SMT") components onto a flexible circuit and using a localized heat source to reflow the SMT components. The reflow forms the assembled flexible circuit 104. The assembled flexible circuit 104 is then tested for continuity.

Figure 3:
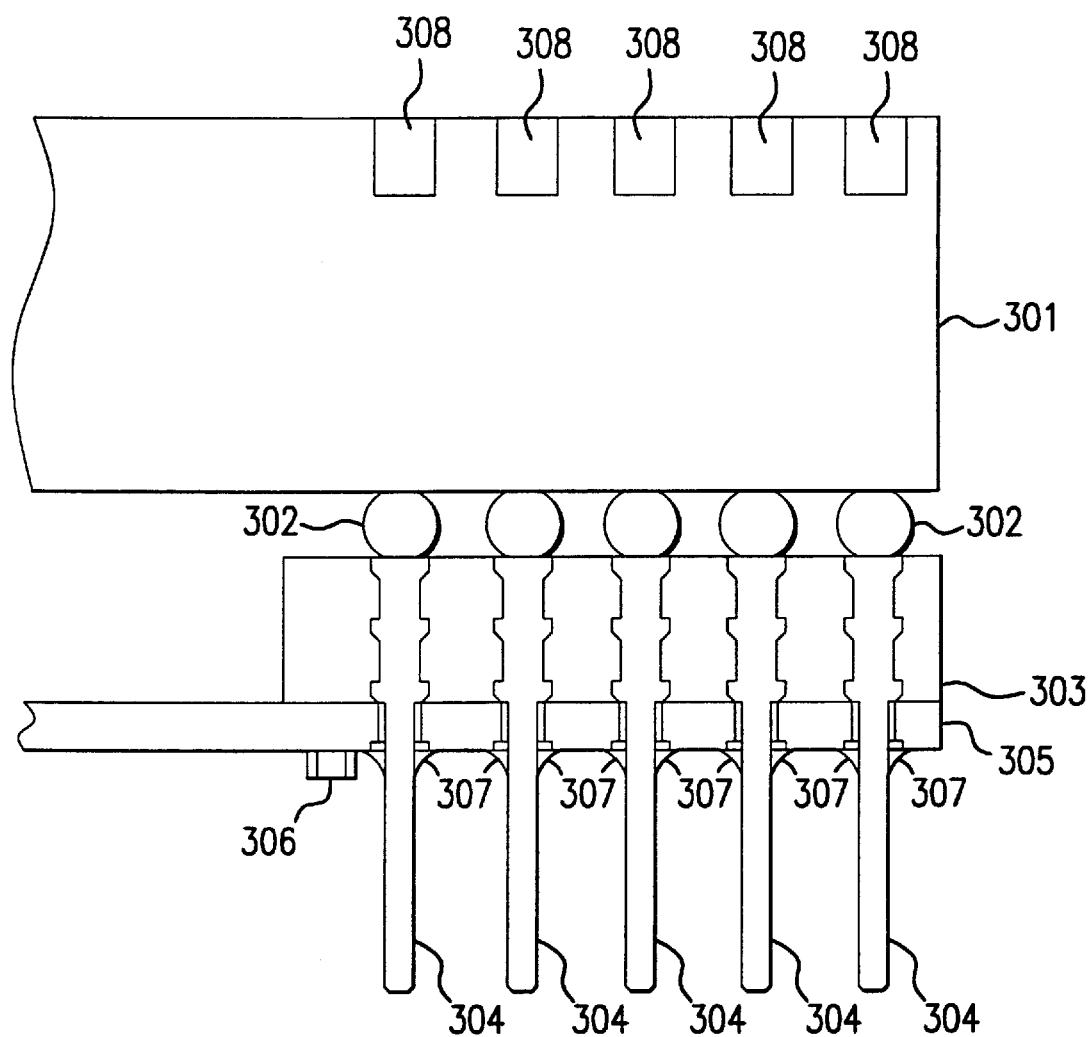
FIG. 3 is a partial side view of a BGA-PGA-Flex probe.

FIG. 3 shows a partial side view of a BGA-PGA-Flex probe assembly assembled in accordance with the invention.

The assembly comprises a BGA socket 301, a plurality of BGA solder balls 302 attached to a PGA header 303, a plurality of nail head pins 304, a flexible circuit 305 and a resistor 306 soldered to the flex circuit 305. The flex circuit 305 is inserted onto the pins 304 of the PGA header 303 and soldered thereto utilizing solder preforms 307.

The BGA socket 301 is preferably a ZIF socket allowing easy insertion of a processor (not shown) into the insertion holes 308 in the top of the socket 301. Also preferably, the plurality of nail head pins 304 are 0.012 inch diameter pins with 0.020 inch pin heads allowing proper reflow of the plurality of solder balls 302. The preferred composition of the plurality of nail head pins 304 is brass C3600, ASTM-B-16 with a 0.000010 inch gold over 0.000050 inch nickel plating. Also preferably, the flexible circuit 305 is a 0.017 inch thick multi-layer flexible circuit. Also preferably, the resister 306 is a 0201 resistor. A person skilled in the art will appreciate that the material, size, thickness and other characteristics of the components can vary in accordance with the method of the invention to achieve proper reflow and soldering of components.

While the method of the present invention has been illustrated and described in connection with the preferred embodiment, it is not to be limited to the particular structure shown.

What is claimed is:

1. A method of constructing a Ball-Grid-Array-Pin-Grid-Array-Flex (BGA-PGA-Flex) probe comprising the steps of:

soldering a Ball Grid-Array (BGA) socket onto a Pin-Grid-Array (PGA) header to form a BGA-PGA assembly;

testing the BGA-PGA assembly for continuity;

inserting a flex assembly onto the BGA-PGA assembly;

placing solder preforms over each PGA pin; and using a localized heat source to reflow the flex assembly to the BGA-PGA assembly.

2. The method of claim 1 wherein the step of soldering a BGA socket onto a PGA header comprises using reflow.

3. The method of claim 1 wherein the step of inserting a flex assembly onto the Ball-Grid-Array-Pin-Grid-Array (BGA-PGA) assembly is preceded by a step of assembling said flex assembly, said step comprising:

placing all Surface Mount Technology (SMT) components onto a flexible circuit;

using a localized heat source to reflow said SMT components; and testing said flex assembly for continuity.

4. The method of claim 3 wherein said localized heat source is a reflow oven.

5. The method of claim 3 wherein said localized heat source is a soldering pencil or a heat gun.

6. The method of claim 3 wherein said localized heat source is an IR source.

7. The method of claim 3 wherein said step of using a localized heat source to reflow the flex assembly to the BGA-PGA heats only one side of the assembly and minimizes migration of solder.

8. The method of claim 7 wherein said localized heat source heats said solder performs to a range of temperatures ranging from 183 degrees Celsius to over 183 degrees Celsius.

9. The method of claim 8 wherein said temperature is in the range of 200 degrees Celsius to 250 degrees Celsius.

10. The method of claim 9 wherein said localized heat source is applied for approximately between 60 and 120 seconds.

11. The method of claim 7 wherein said localized heat source is a hot air source.

12. The method of claim 7 wherein said localized heat source is an IR heat source.

* * * * *